(12) United States Patent
Takagi

(10) Patent No.: US 10,658,625 B2
(45) Date of Patent: May 19, 2020

(54) DISPLAY DEVICE

(71) Applicant: Japan Display Inc., Minato-ku (JP)

(72) Inventor: Jun Takagi, Minato-ku (JP)

(73) Assignee: Japan Display Inc., Minato-ku (JP)

(*) Notice: Subject to any disclaimer, the term of this patent is extended or adjusted under 35 U.S.C. 154(b) by 0 days.

(21) Appl. No.: 16/122,370

(22) Filed: Sep. 5, 2018

(65) Prior Publication Data

US 2019/0074470 A1 Mar. 7, 2019

(30) Foreign Application Priority Data

Sep. 6, 2017 (JP) .................................. 2017-171108

(51) Int. Cl.

| | |
|---|---|
| *H01L 51/52* | (2006.01) |
| *H01L 27/32* | (2006.01) |
| *H01L 51/00* | (2006.01) |
| *H01L 51/50* | (2006.01) |
| *G09G 3/3266* | (2016.01) |
| *G09G 3/3275* | (2016.01) |
| *G09G 3/3225* | (2016.01) |

(52) U.S. Cl.
CPC ........ *H01L 51/529* (2013.01); *H01L 27/3244* (2013.01); *H01L 27/3276* (2013.01); *H01L 51/0097* (2013.01); *H01L 51/5016* (2013.01); *G09G 3/3225* (2013.01); *G09G 3/3266* (2013.01); *G09G 3/3275* (2013.01); *G09G 2300/0809* (2013.01); *H01L 2251/5338* (2013.01)

(58) Field of Classification Search
None
See application file for complete search history.

(56) References Cited

U.S. PATENT DOCUMENTS

2016/0079317 A1* 3/2016 Jeon .................... H01L 27/3225
315/115
2018/0226581 A1* 8/2018 Chang .................. C09K 11/06

FOREIGN PATENT DOCUMENTS

| JP | 2011-65800 | 3/2011 |
|---|---|---|
| JP | 2013-116975 | 6/2013 |

* cited by examiner

*Primary Examiner* — Asok K Sarkar
(74) *Attorney, Agent, or Firm* — Oblon, McClelland, Maier & Neustadt, L.L.P.

(57) ABSTRACT

A display device includes: a substrate; a first organic light-emitting diode including a first electrode provided above the substrate for each of pixels, a second electrode, and a first light-emitting layer provided between the first electrode and the second electrode; and a heat-generating member supplying heat to the first light-emitting layer.

16 Claims, 8 Drawing Sheets

DISPLAY DEVICE

CROSS-REFERENCE TO RELATED APPLICATION

The present application claims priority from Japanese application JP2017-171108 filed on Sep. 6, 2017, the content of which is hereby incorporated by reference into this application.

BACKGROUND OF THE INVENTION

1. Field of the Invention

The present invention relates to a display device.

2. Description of Related Art

A flat panel display such as an organic electroluminescent (EL) display device includes a display panel in which a thin film transistor (TFT), an organic light-emitting diode (OLED), and the like are formed on a substrate.

JP 2013-116975 A discloses that a thermally active fluorescence-delaying material, that is, a thermally activated delayed fluorescent (TADF) material is used for a light-emitting layer of the organic EL display device.

SUMMARY OF THE INVENTION

In the conventional configuration, however, a further improvement in fluorescence emission efficiency in the light-emitting layer becomes a challenge. That is, a further improvement in the efficiency of reverse intersystem crossing of a light-emitting material, such as the thermally activated delayed fluorescent material, used for the light-emitting layer to the excited singlet state after transition to the excited triplet state becomes a challenge.

The invention has been made in view of the above problem, and it is an object of the invention to achieve a further improvement in fluorescence emission efficiency in a light-emitting layer.

One of the aspects of the present invention may be a display device including: a substrate; a first organic light-emitting diode including a first electrode provided above the substrate for each of pixels, a second electrode, and a first light-emitting layer provided between the first electrode and the second electrode; and a heat-generating member supplying heat to the first light-emitting layer.

DETAILED DESCRIPTION OF THE INVENTION

First Embodiment

Figure 1:
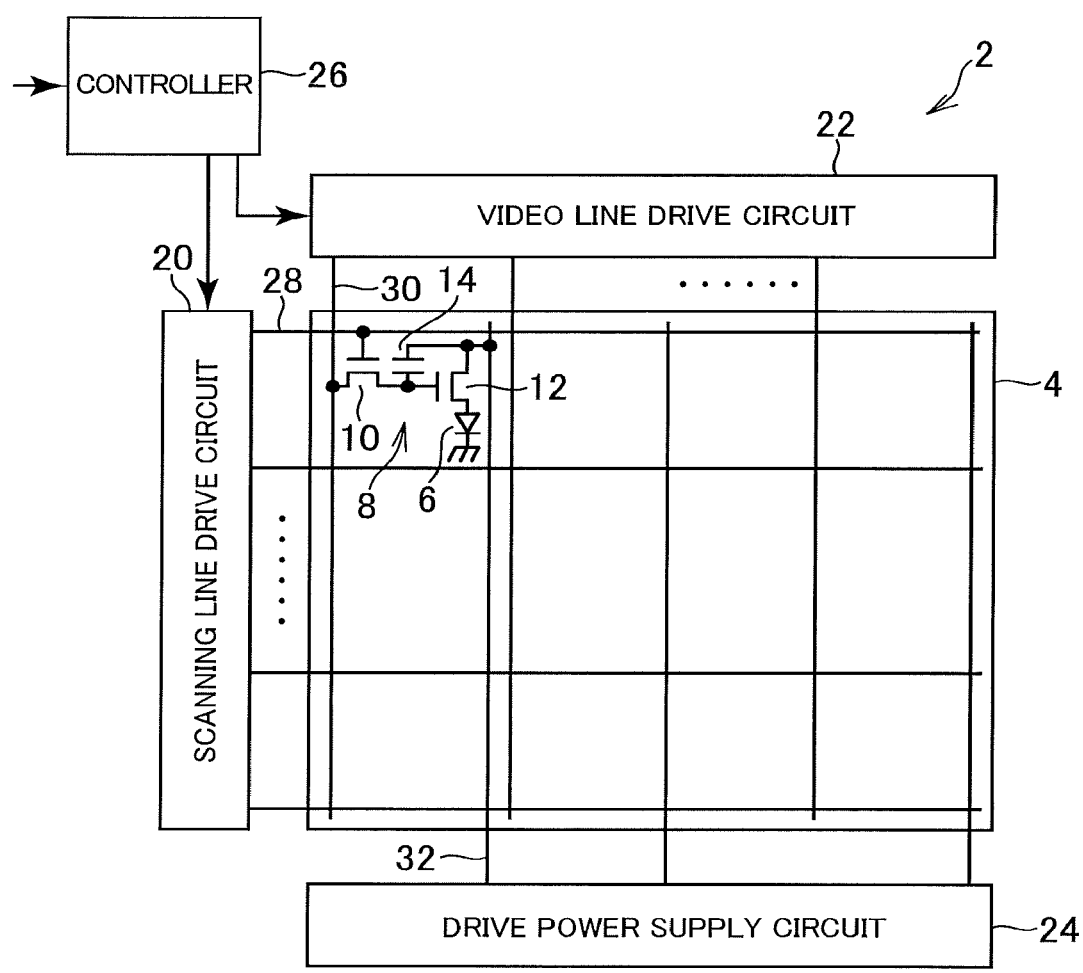
FIG. 1 is a schematic view showing a schematic configuration of a display device according to an embodiment.

Hereinafter, an embodiment of the invention will be described based on the drawings.

The disclosure is illustrative only. Appropriate modifications that will readily occur to those skilled in the art and fall within the spirit of the invention are of course included in the scope of the invention. In the drawings, for more clarity of description, the width, thickness, shape, and the like of each part may be schematically represented, compared to those in practicing aspects of the invention. However, they are illustrative only, and do not limit the interpretation of the invention. Moreover, in the specification and the drawings, elements similar to those described in relation to a previous drawing are denoted by the same reference numerals and signs, and a detailed description may be appropriately omitted.

Further, in the detailed description of the invention, the terms "on", "above", "under", and "below" as used in defining the positional relationship between one component and another component include, not only the case where one component is located directly on or directly below another component, but also the case where still another component intervenes between the components unless otherwise noted.

A display device 2 according to the embodiment is, for example, an organic electroluminescent display device, and may be mounted in a television set, a personal computer, a portable terminal, a mobile phone, or the like. FIG. 1 is a schematic view showing a schematic configuration of the display device 2 according to the embodiment. The display device 2 includes a pixel array section 4 that displays an image, and a drive section that drives the pixel array section 4. The display device 2 may include a base material made of glass or the like. The display device 2 may be a flexible display having flexibility. In this case, the display device 2 may include a base material composed of a resin film or the like having flexibility. The display device 2 includes a wiring layer including a wiring provided inside or above the base material.

In the pixel array section 4, organic light-emitting diodes 6 and pixel circuits 8 are disposed in a matrix corresponding to pixels. The pixel circuit 8 includes a lighting thin film transistor (TFT) 10, a drive TFT 12, and a capacitor 14.

The drive section includes a scanning line drive circuit 20, a video line drive circuit 22, a drive power supply circuit 24, and a controller 26. The drive section drives the pixel circuit 8 and controls emission of the organic light-emitting diode 6.

The scanning line drive circuit 20 is connected to a scanning signal line 28 provided for each array of pixels in the horizontal direction (a pixel row). The scanning line drive circuit 20 sequentially selects the scanning signal line 28 in response to a timing signal input from the controller 26, and applies a voltage for turning on the lighting TFT 10 to the selected scanning signal line 28.

The video line drive circuit 22 is connected to a video signal line 30 provided for each array of pixels in the vertical direction (a pixel column). The video line drive circuit 22 receives a video signal from the controller 26, and outputs, in synchronization with the selection of the scanning signal line 28 by the scanning line drive circuit 20, a voltage in response to the video signal of the selected pixel row to each of the video signal lines 30. The voltage is written to the capacitor 14 via the lighting TFT 10 in the selected pixel row. The drive TFT 12 supplies a current in response to the written voltage to the organic light-emitting diode 6, and thus the organic light-emitting diode 6 of the pixel corresponding to the selected scanning signal line 28 emits light.

The drive power supply circuit 24 is connected to a drive power supply line 32 provided for each pixel column, and supplies a current to the organic light-emitting diode 6 via the drive power supply line 32 and the drive TFT 12 in the selected pixel row.

Here, a lower electrode of the organic light-emitting diode 6 is connected to the drive TFT 12. An upper electrode of the organic light-emitting diodes 6 is composed of an electrode common to the organic light-emitting diodes 6 of all pixels. When the lower electrode is configured as an anode, a high potential is input thereto and a low potential is input to the upper electrode that serves as a cathode. When the lower electrode is configured as a cathode, a low potential is input thereto and a high potential is input to the upper electrode that serves as an anode.

Figure 2:
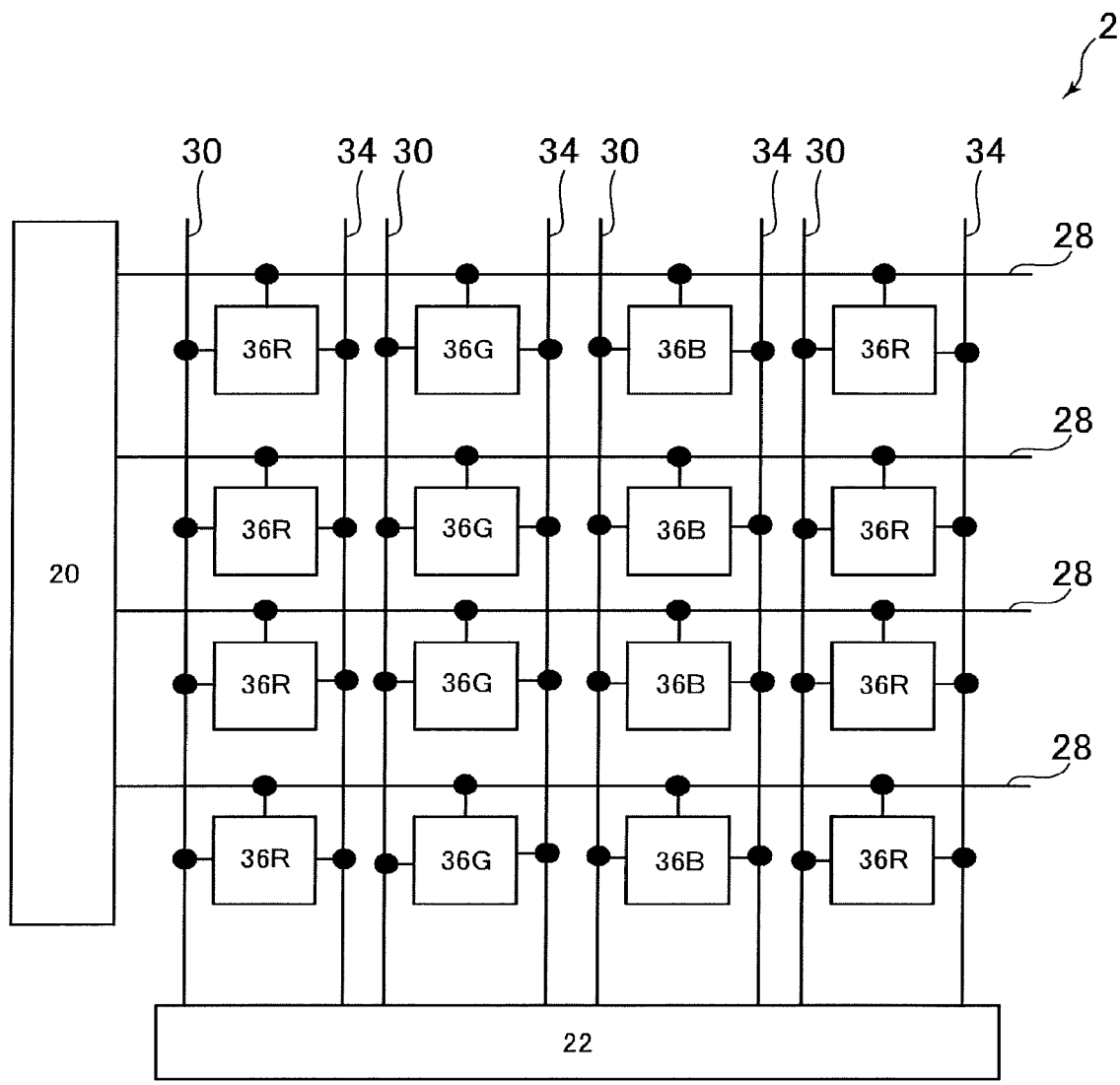
FIG. 2 is a schematic view showing an example of an outline of a pixel matrix circuit of the display device according to the embodiment.

FIG. 2 is a schematic view showing an outline of a pixel matrix circuit of the display device 2 according to the embodiment. In the example shown in FIG. 2, for simplifying the drawing, the pixel circuit 8 shown in FIG. 1 is illustrated using a sub-light-emitting pixel 36R emitting red light, a sub-light-emitting pixel 36G emitting green light, and a sub-light-emitting pixel 36B emitting blue light. Moreover, the controller 26 and the drive power supply circuit 24, which are shown in FIG. 1, are omitted.

In the example shown in FIG. 2, the video line drive circuit 22 includes a first heat-source power supply line control circuit, and the video line drive circuit 22 is connected not only to the video signal lines 30 but also to first heat-source power supply lines 34. That is, the video line drive circuit 22 including the first heat-source power supply line control circuit controls a voltage to be applied to the first heat-source power supply line 34. In this example, the first heat-source power supply lines 34 are respectively connected to the sub-light-emitting pixel 36R emitting red light, the sub-light-emitting pixel 36G emitting green light, and the sub-light-emitting pixel 36B emitting blue light, and have the roll of supplying heat to the sub-light-emitting pixels.

Figure 3:
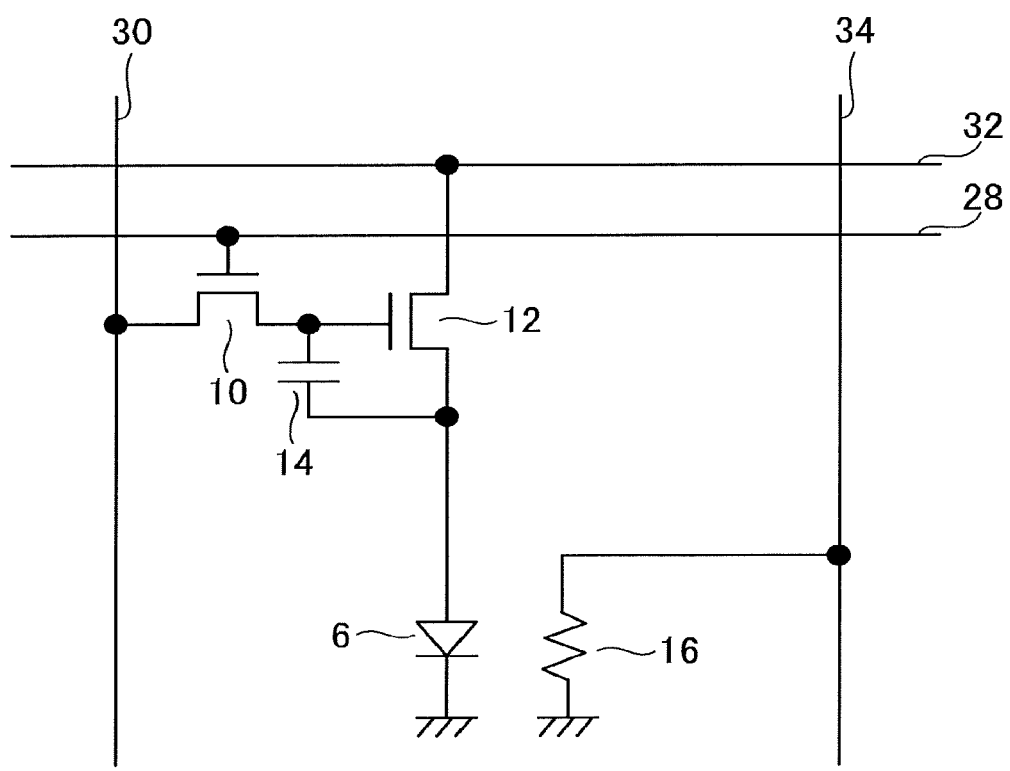
FIG. 3 is a schematic view showing an example of a circuit configuration of the sub-light-emitting pixel shown in FIG. 2.

FIG. 3 is a schematic view showing a circuit configuration of the sub-light-emitting pixel shown in FIG. 2. As described above with reference to FIG. 1, the scanning line drive circuit 20 is connected to the scanning signal lines 28, sequentially selects the scanning signal line 28 in response to the timing signal input from the controller 26, and applies the voltage for turning on the lighting TFT 10 to the selected scanning signal line 28. Moreover, the video line drive circuit 22 is connected to the video signal lines 30, receives the video signal from the controller 26, and outputs, in synchronization with the selection of the scanning signal line 28 by the scanning line drive circuit 20, the voltage to each of the video signal lines 30 in response to the video signal of the selected pixel row. The voltage is written to the capacitor 14 via the lighting TFT 10. The drive TFT 12 supplies the current to the organic light-emitting diode 6 in response to the written voltage, and the organic light-emitting diode 6 of the pixel corresponding to the selected scanning signal line 28 emits light.

Further, in the embodiment, the first heat-source power supply line 34 connected to the video line drive circuit is provided for each array of pixels in the vertical direction (a pixel column). The first heat-source power supply line 34 is not directly connected with the organic light-emitting diode 6, the lighting TFT 10, the drive TFT 12, and the capacitor 14, but is connected to one end of a heat source resistor 16 as a heat-generating member in the embodiment. The heat source resistor 16 is disposed in the vicinity of the organic light-emitting diode 6. The other end of the heat source resistor 16 is fixed at the ground potential, or may be configured to be connected to the cathode of the organic light-emitting diode 6. In the embodiment, an exemplary configuration will be described in which the other end of the heat source resistor 16 is connected to the cathode of the organic light-emitting diode 6.

The heat source resistor 16 may be configured using a polysilicon film, an organic material doped with an impurity so that the resistance value of the heat source resistor 16 is lower than that of the organic light-emitting diode 6, a conductive polymer material, or the like.

A voltage different from that of the cathode of the organic light-emitting diode 6 is applied from the first heat-source power supply line control circuit included in the video line drive circuit 22 to the first heat-source power supply line 34, and thus the heat source resistor 16 generates heat. That is, the first heat-source power supply line control circuit controls the potential at the one end of the heat source resistor 16 so as to be different from the potential of the cathode of the organic light-emitting diode 6, and thus heat is supplied to a light-emitting layer of the organic light-emitting diode 6. When the other end of the heat source resistor 16 is fixed at the ground potential, the first heat-source power supply line control circuit controls the potential at the one end of the heat source resistor 16 so as to be different from the ground potential.

When it is unnecessary to supply heat to the light-emitting layer of the organic light-emitting diode 6, that is, when it is unnecessary to supply heat to the sub-light-emitting pixel, the first heat-source power supply line control circuit applies a voltage at the same potential as that of the cathode of the organic light-emitting diode 6 to the first heat-source power supply line 34. That is, the first heat-source power supply line control circuit controls the potential at the one end of the heat source resistor 16 to be the same as the potential of the cathode of the organic light-emitting diode 6. When the other end of the heat source resistor 16 is fixed at the ground potential, the first heat-source power supply line control circuit controls the potential at the one end of the heat source resistor 16 to be the ground potential.

The voltage to be applied to the first heat-source power supply line 34 may be configured such that the voltage is set at multiple levels in response to an external request.

By controlling the voltage to be applied to the first heat-source power supply line 34 as described above, heat is applied to the organic light-emitting diode 6, as a result of which it is possible to improve the efficiency of reverse intersystem crossing of a light-emitting material, such as a thermally activated delayed fluorescent material, used for the light-emitting layer to the excited singlet state after transition to the excited triplet state. That is, the heat generated by the heat source resistor 16 as a heat-generating member promotes the reverse intersystem crossing of the light-emitting material in the excited triplet state to the excited singlet state, and thus fluorescence emission efficiency in the light-emitting layer included in the organic light-emitting diode 6 is improved.

In the embodiment, an exemplary configuration has been described in which the video line drive circuit 22 includes the first heat-source power supply line control circuit and the video line drive circuit 22 applies the voltage to the first heat-source power supply line 34. A configuration may be employed in which the first heat-source power supply line control circuit controlling the first heat-source power supply line 34 is provided separately from the video line drive circuit 22.

Figure 4:
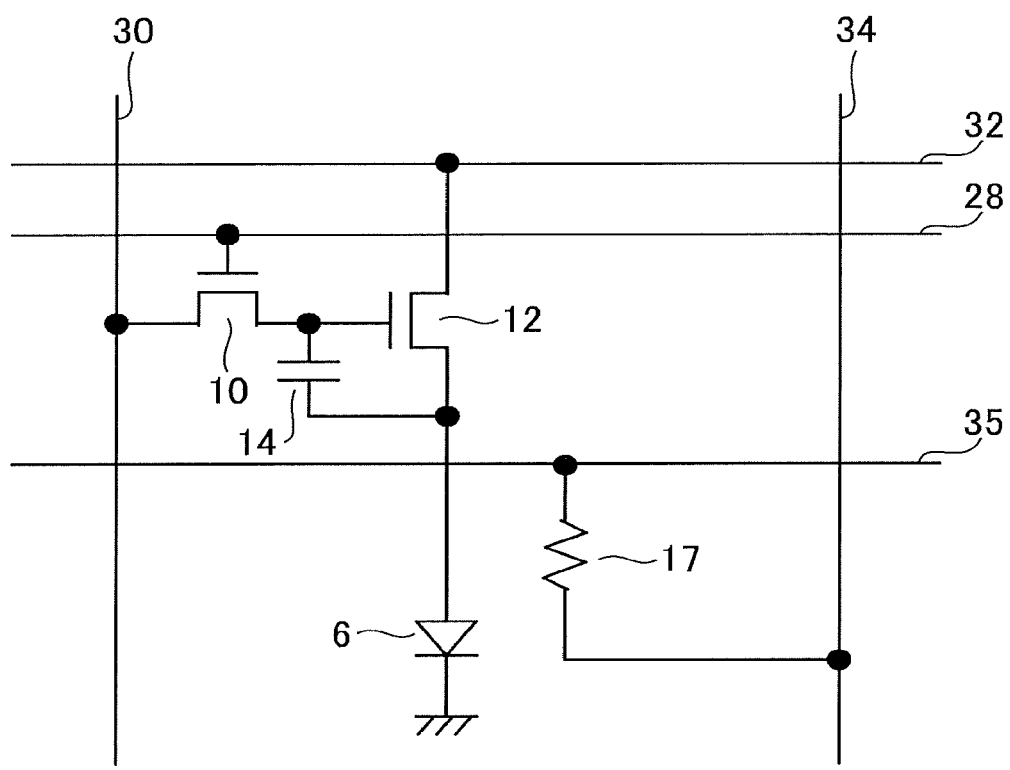
FIG. 4 is a schematic view showing another example of a circuit configuration of the sub-light-emitting pixel shown in FIG. 2.

FIG. 4 is a schematic view showing another example of the circuit configuration of the sub-light-emitting pixel. In the example shown in FIG. 4, a second heat-source power supply line 35 provided for each array of pixels in the horizontal direction (a pixel row) is included in addition to the first heat-source power supply line 34 provided for each array of pixels in the vertical direction (a pixel column). The second heat-source power supply line 35 is connected to a second heat-source power supply line control circuit, and the second heat-source power supply line control circuit controls a voltage to be applied to the second heat-source power supply line 35.

In addition, the sub-light-emitting pixel includes a heat source resistor 17 connected to the first heat-source power supply line 34 and the second heat-source power supply line 35. One end of the heat source resistor 17 is connected to the first heat-source power supply line 34, and the other end of the heat source resistor 17 is connected to the second heat-source power supply line 35.

The heat source resistor 17 in this example may be configured using a low-temperature polycrystalline silicon thin film doped with an impurity, or other conductors.

By making voltages to be respectively applied to the first heat-source power supply line 34 and the second heat-source power supply line 35 different from each other, the heat source resistor 17 is caused to generate heat. That is, the first heat-source power supply line control circuit controls, via the first heat-source power supply line 34, a potential at one end of the heat source resistor 17 so as to be different from a potential at the other end of the heat source resistor 17 connected to the second heat-source power supply line control circuit, and thus heat is supplied to the light-emitting layer of the organic light-emitting diode 6. Alternatively, the second heat-source power supply line control circuit controls, via the second heat-source power supply line 35, the potential at the other end of the heat source resistor 17 so as to be different from the potential at the one end of the heat source resistor 17 connected to the first heat-source power supply line control circuit, and thus heat is supplied to the light-emitting layer of the organic light-emitting diode 6.

When it is unnecessary to supply heat to the light-emitting layer of the organic light-emitting diode 6, that is, when it is unnecessary to supply heat to the sub-light-emitting pixel, a voltage at the same potential is applied to both the first heat-source power supply line 34 and the second heat-source power supply line 35. That is, the first heat-source power supply line control circuit controls, via the first heat-source power supply line 34, the potential at the one end of the heat source resistor 17 so as to be the same as the potential at the other end of the heat source resistor 17 connected to the second heat-source power supply line control circuit. Alternatively, the second heat-source power supply line control circuit controls, via the second heat-source power supply line 35, the potential at the other end of the heat source resistor 16 so as to be the same as the potential at the one end of the heat source resistor 17 connected to the first heat-source power supply line control circuit.

The voltage to be applied to the first heat-source power supply line 34 and the second heat-source power supply line 35 may be configured such that the voltage is set at multiple levels in response to an external request. The driving of the first heat-source power supply line 34 and the driving of the second heat-source power supply line 35 are interchangeable. Moreover, one of the first heat-source power supply line 34 and the second heat-source power supply line 35 may be fixed at the ground potential or the like.

The scanning line drive circuit 20 or the video line drive circuit 22 may be configured to include the second heat-source power supply line control circuit. In this case, the second heat-source power supply line 35 is controlled by the scanning line drive circuit 20 or the video line drive circuit 22. Moreover, a configuration may be employed in which the second heat-source power supply line control circuit controlling the second heat-source power supply line 35 is separately provided.

By controlling at least one of the voltage to be applied to the first heat-source power supply line 34 and the voltage to be applied to the second heat-source power supply line as described above, heat is applied to the organic light-emitting diode 6. As a result, the efficiency of reverse intersystem crossing of a light-emitting material, such as a thermally activated delayed fluorescent material, used for the light-emitting layer to the excited singlet state after transition to the excited triplet state is improved. That is, the heat generated by the heat source resistor 17 as a heat-generating member promotes the reverse intersystem crossing of the light-emitting material in the excited triplet state to the excited singlet state, and thus fluorescence emission efficiency in the light-emitting layer included in the organic light-emitting diode 6 is improved. Moreover, the response speed of a light-emitting element is limited by energy conversion under low temperatures, and therefore, an afterimage is likely to occur. This configuration suppresses the occurrence of a trouble due to the occurrence of an afterimage.

Figure 5:
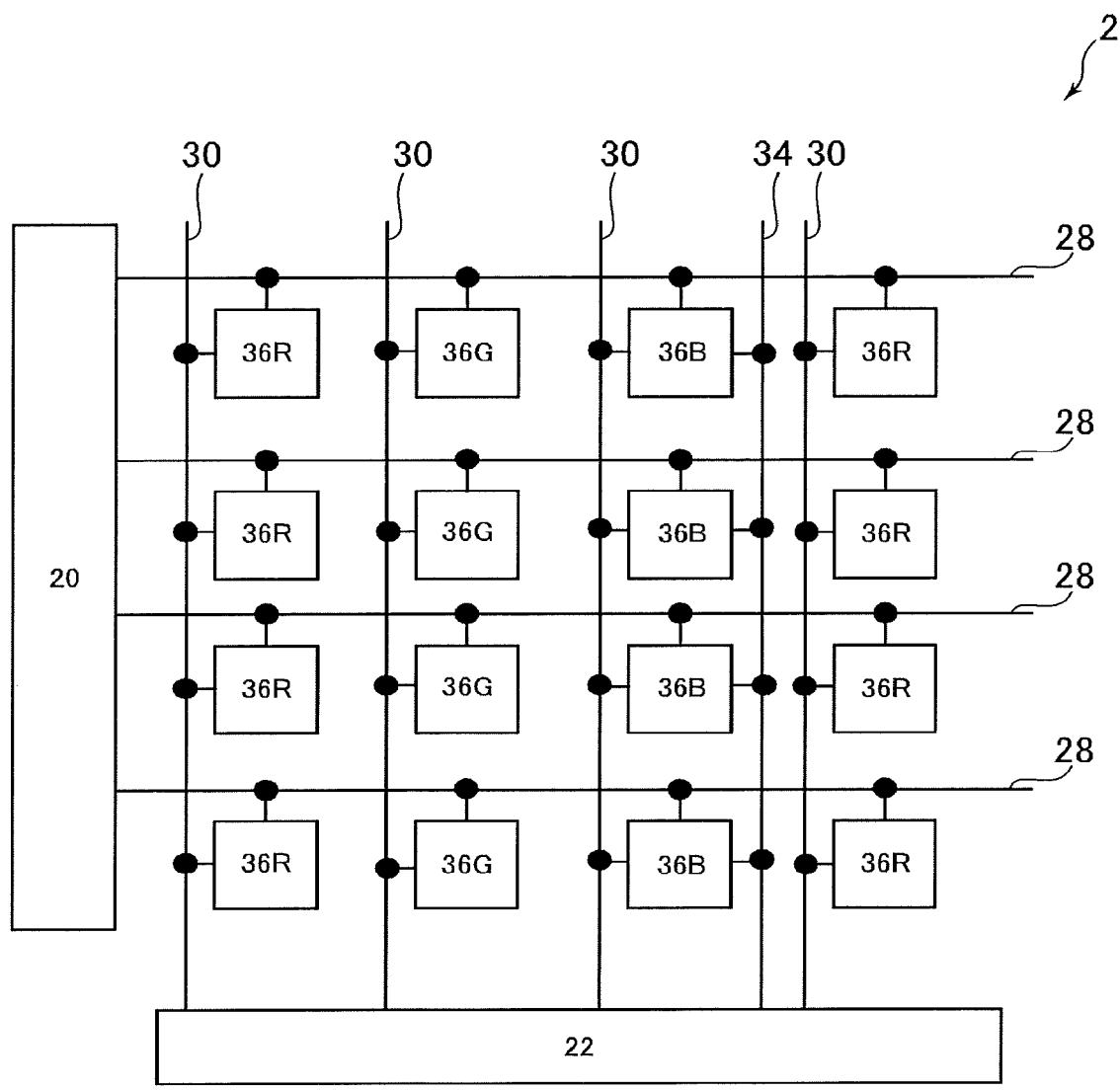
FIG. 5 is a schematic view showing another example of an outline of a pixel matrix circuit of the display device according to the embodiment.

FIG. 5 is a schematic view showing another example of the pixel matrix circuit of the display device 2 according to the embodiment. In the example shown in FIG. 5, a configuration is employed in which the first heat-source power supply line 34 is provided only in the pixel column of the sub-light-emitting pixel 36B emitting blue light. This configuration is effective when, for example, a thermally activated delayed fluorescent (TADF) material, which is likely to cause an afterimage under low temperatures, is used for the light-emitting layer of the organic light-emitting diode 6 emitting blue light and a phosphorescent element is used for the organic light-emitting diodes 6 emitting red and green lights. The reasons will be described below.

First, the number of the first heat-source power supply lines 34 is reduced by employing a configuration in which the first heat-source power supply line 34 is not provided for the sub-light-emitting pixel 36R emitting red light and the sub-light-emitting pixel 36G emitting green light, to which it is unnecessary to supply heat. Therefore, the configuration of the pixel circuit 8 is simplified, which is advantageous for improving productivity.

Moreover, the sub-light-emitting pixel 36R emitting red light and the sub-light-emitting pixel 36G emitting green light are not heated, and therefore, power consumption is suppressed.

Further, by suppressing the transfer of heat to the organic light-emitting diodes 6 emitting red and green lights, which are phosphorescent elements not including a thermally active material, the shortening of the life time of the organic light-emitting diodes 6 emitting red and green lights is suppressed.

Figure 6:
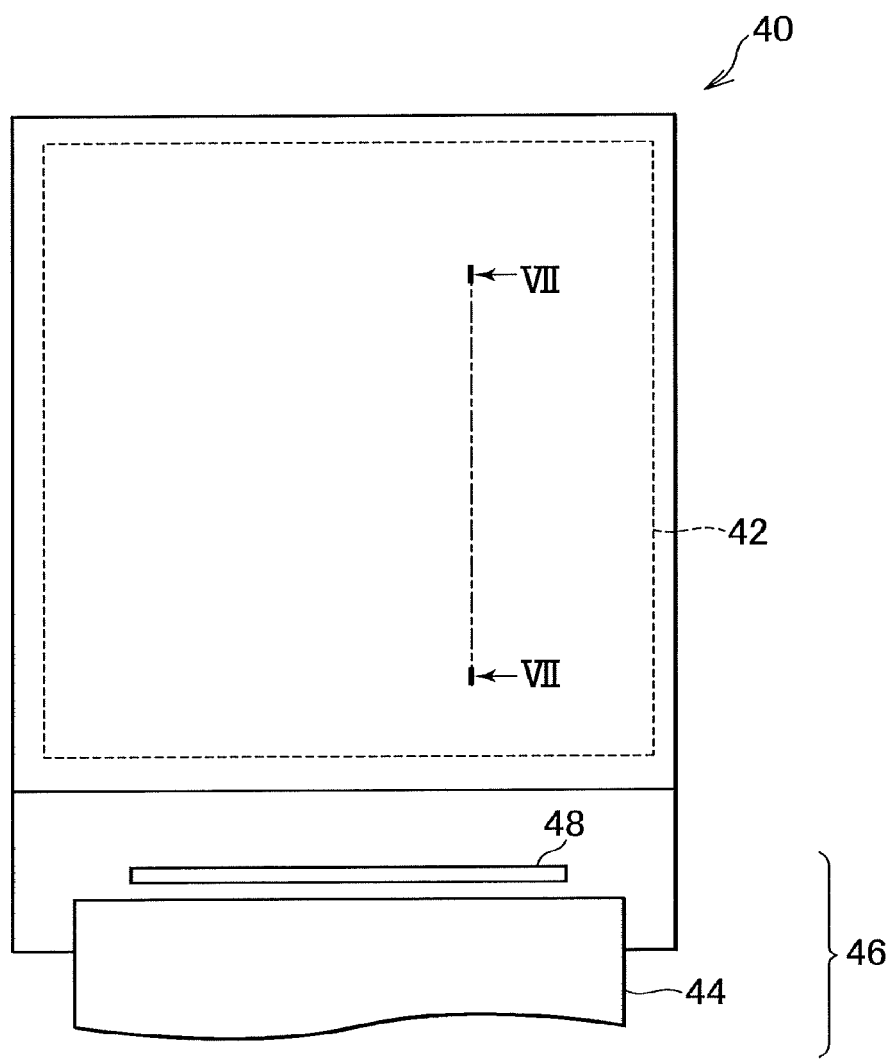
FIG. 6 is a schematic plan view of a display panel in the display device according to the embodiment.

FIG. 6 is a schematic plan view of a display panel 40 of the display device 2. The pixel array section 4 shown in FIG. 1 is provided in a display region 42 of the display panel 40, and the organic light-emitting diodes 6 are arranged in the pixel array section 4 as described above.

A drive section forming region 46 is provided outside the display region 42 in the display panel 40, and wirings connected to the display region 42 are disposed in the drive section forming region 46. Further, a driver IC 48 constituting the drive section is mounted in the drive section forming region 46, or a flexible printed circuit (FPC) 44 is connected thereto. The FPC 44 is connected to the scanning line drive circuit 20, the video line drive circuit 22, the drive power supply circuit 24, the controller 26, and the like, or an IC is mounted on the FPC 44.

Figure 7:
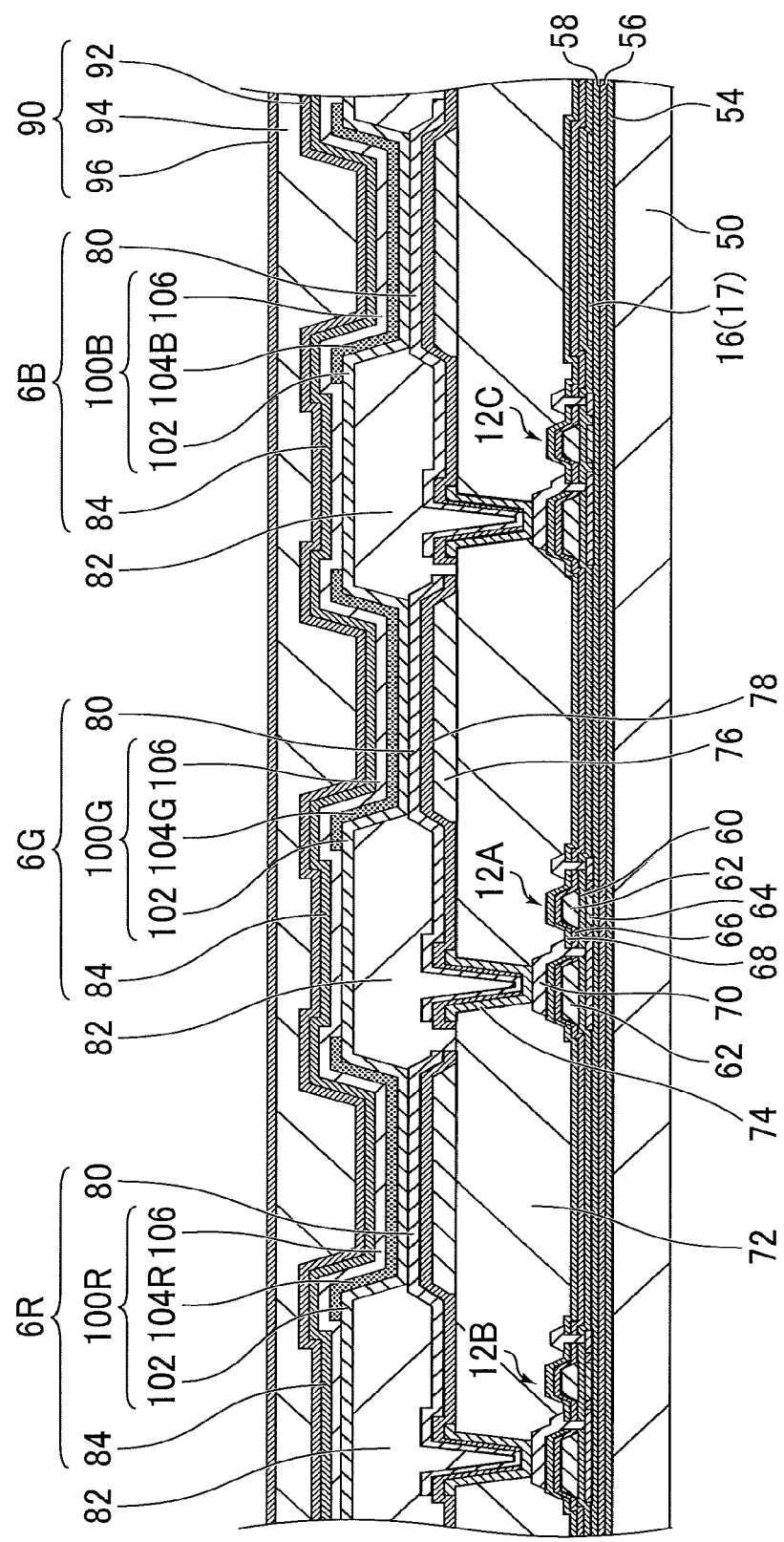
FIG. 7 is an example of a schematic vertical sectional view of the display panel at a position along line VII-VII shown in FIG. 6.

Hereinafter, one example in the embodiment will be described with reference to FIG. 7. FIG. 7 is a schematic vertical sectional view of the display panel 40 at a position along line VII-VII shown in FIG. 6.

As shown in FIG. 7, the display panel 40 according to the embodiment includes an array substrate 50. In the embodiment, polyimide is used as a material constituting the array substrate 50. However, other resin materials may be used as the material constituting the array substrate 50 when a base material has sufficient flexibility as a sheet display.

A three-layer stacked structure including a first silicon oxide film 54, a first silicon nitride film 56, and a second silicon oxide film 58 is provided as an undercoat layer above the array substrate 50. The first silicon oxide film 54 in the lowermost layer is provided to improve the adhesion to the array substrate 50. The first silicon nitride film 56 in the middle layer is provided as a block film for moisture and impurities from the outside. The second silicon oxide film 58 in the uppermost layer is provided as a block film to prevent hydrogen atoms contained in the first silicon nitride film 56 from diffusing to a semiconductor layer side. The undercoat layer is not particularly limited to this structure. The undercoat layer may have a structure including a further stacked layer, or may have a single-layer structure or a stacked structure of two or more layers.

The heat source resistor 16 (or the heat source resistor 17) described above is provided above the undercoat layer. In the example shown in FIG. 7, a configuration is illustrated in which the heat source resistor 16 (or the heat source resistor 17) is provided on the upper surface of the undercoat layer. However, the arrangement location of the heat source resistor 16 (or the heat source resistor 17) may be located between the plurality of layers of the undercoat layer or below the undercoat layer. Moreover, a configuration may be employed in which a planarization film 72 to be described later is composed of a plurality of layers and the heat source resistor 16 (or the heat source resistor 17) is disposed between the plurality of layers of the planarization film 72.

The heat source resistor 16 (or the heat source resistor 17) is disposed so as to overlap, in a plan view, a first light-emitting layer 104B to be described later. By employing such a configuration, heat is applied to the first light-emitting layer 104B in a first organic light-emitting diode 6B, as a result of which it is possible to improve the efficiency of reverse intersystem crossing of a light-emitting material, such as a thermally activated delayed fluorescent material, used for the first light-emitting layer 104B to the excited singlet state after transition to the excited triplet state. That is, the heat generated by the heat source resistor 16 (or the heat source resistor 17) as a heat-generating member promotes the reverse intersystem crossing of the light-emitting material in the excited triplet state to the excited singlet state, and thus fluorescence emission efficiency in the light-emitting layer included in the first organic light-emitting diode 6B is improved.

Moreover, a first drive TFT 12A, a second drive TFT 12B, and a third drive TFT 12C are provided above the undercoat layer. Each of the drive TFTs 12 has a structure in which a low-concentration impurity region is provided between a channel region and a source-drain region. In the embodiment, a silicon oxide film is used as a gate insulating film 60, and a first wiring 62 formed of a stacked structure of Ti and Al is used as a gate electrode. The first wiring 62 functions as a storage capacitance line in addition to its function as the gate electrode of the drive TFT 12. That is, the first wiring 62 is used to form a storage capacitance between a polysilicon film 64 and the first wiring 62.

In the embodiment, when the polysilicon film 64 in the drive TFT 12 is deposited, the heat source resistor 16 (17) is deposited using the same material. By employing such a manufacturing method, the step of depositing the polysilicon film 64 and the step of depositing the heat source resistor 16 (17) are performed in the same step, and therefore, high productivity is achieved.

The heat source resistor 16 (17) may be deposited in another step different from the step of depositing the polysilicon film 64 in the drive TFT 12, and may be formed using a material different from that of the polysilicon film 64.

Figure 8:
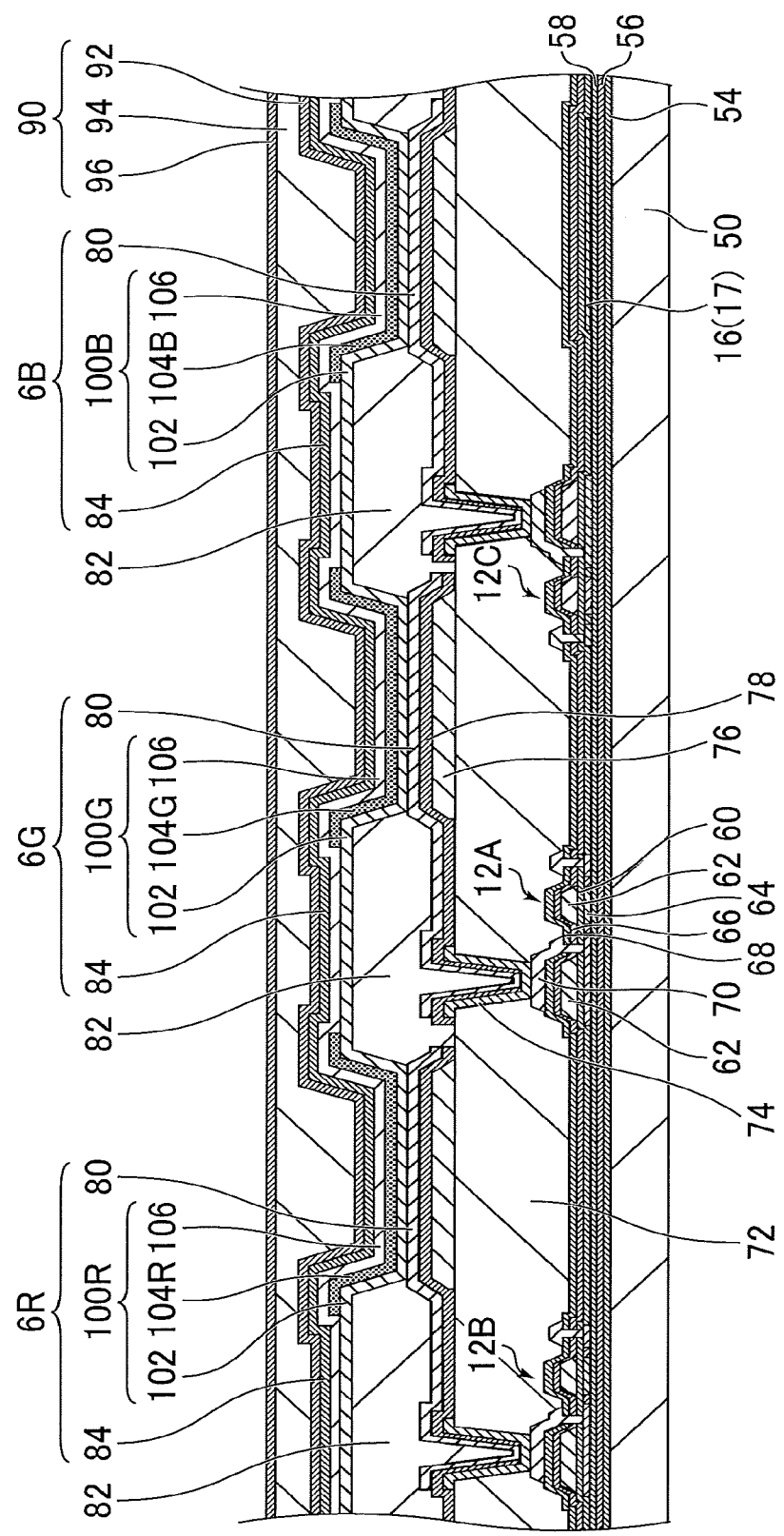
FIG. 8 is another example of a schematic vertical sectional view of the display panel at the position along line VII-VII shown in FIG. 6.

With respect to an arrangement of the third drive TFT 12C, a space for arranging the heat source resistor 16 (or the heat source resistor 17) is secured by disposing the third drive TFT 12C at a position away from the first light-emitting layer 104B as shown in FIG. 8.

Above the drive TFT 12, a second silicon nitride film 66 serving as an interlayer insulating film and a third silicon oxide film 68 are stacked, and further, a second wiring 70 serving as a source-drain electrode and a routing wiring is formed. In the embodiment, the second wiring 70 is configured to have a three-layer stacked structure of Ti, Al, and Ti. A storage capacitance is formed by the interlayer insulating film, an electrode formed of a conductive layer in the same layer as the first wiring 62, and an electrode formed of a conductive layer in the same layer as a source-drain wiring of the drive TFT 12. The routing wiring is extended to the edge of perimeter of the array substrate 50, and forms a terminal to connect the FPC 44 or the driver IC 48 shown in FIG. 2.

The planarization film 72 is formed above the drive TFT 12. As the planarization film 72, an organic material such as a photosensitive acrylic resin or polyimide is used in many cases. The planarization film 72 has excellent surface flatness compared to an inorganic insulating material formed by a chemical vapor deposition (CVD) method or the like. The planarization film 72 is removed in a pixel contact section and a peripheral region. The upper surface of the second wiring 70 exposed by the removal of the planarization film 72 is covered by a transparent conductive film 74 made of indium tin oxide (ITO) or the like.

Subsequently, a third wiring 76 is provided in the same layer as the transparent conductive film 74. In the embodiment, the third wiring 76 is provided to have a three-layer stacked structure of Mo, Al, and Mo, and is used for a peripheral routing wiring or the formation of a capacitive element additionally provided in a pixel. Covering the upper surface of the second wiring 70 exposed after removing the planarization film 72 with the transparent conductive film 74, as mentioned above, also means to protect the exposed surface of the second wiring 70 from a patterning process of the third wiring 76. The transparent conductive film 74 and the upper surface of the third wiring 76 are temporarily covered with a third silicon nitride film 78. Thereafter, in the pixel contact section of the transparent conductive film 74, an opening is provided in the third silicon nitride film 78, and a portion of the upper surface of the transparent conductive film 74 is exposed.

Thereafter, a lower electrode 80 serving as a pixel electrode is formed so as to be connected to the upper surface of the transparent conductive film 74 exposed through the opening. In the embodiment, the lower electrode 80 is formed as a reflecting electrode, and has a three-layer stacked structure made of ITO, Ag, and ITO. In the pixel contact section, an additional capacitance is formed by the transparent conductive film 74, the third silicon nitride film 78, and the lower electrode 80. Incidentally, the transparent conductive film 74 is partially exposed to an etching environment during the patterning of the lower electrode 80; however, the transparent conductive film 74 has resistance to etching of the lower electrode 80 through an annealing treatment performed during the period from after a forming process of the transparent conductive film 74 to a forming process of the lower electrode 80.

After the forming process of the lower electrode 80, an insulating film 82 called a bank or a rib and serving as a partition wall of a pixel region is formed. As the insulating film 82, a photosensitive acrylic resin or the like is used in the same manner as for the planarization film 72. The insulating film 82 is opened so as to expose the upper surface of the lower electrode 80 as a light-emitting region, and the opening edge preferably has a smooth tapered shape. When the opening edge has a steep shape, a coverage defect of an organic layer 100 to be formed later occurs. Here, the planarization film 72 and the insulating film 82 include a portion where the planarization film 72 and the insulating film 82 are in contact with each other through the opening provided in the third silicon nitride film 78 intervening therebetween. The opening is provided to extract, through the insulating film 82, the moisture or gas desorbed from the planarization film 72 through a heat treatment or the like after the forming process of the insulating film 82.

After the formation of the insulating film 82, organic materials constituting the organic layer 100 are stacked and formed. As a stacked structure constituting the organic layer 100, a hole transport layer 102, a light-emitting layer 104, and an electron transport layer 106 are stacked and formed in order from the lower electrode 80 side. In the embodiment, the hole transport layer 102 and the electron transport layer 106 are formed over a plurality of sub-pixels, and the light-emitting layer 104 is formed for each sub-pixel. The organic layer 100 may be formed by vapor deposition, or may be formed by application through dispersion with a solvent. Moreover, the organic layer 100 may be selectively formed for each sub-pixel, or may be formed in the form of a layer over the entire surface covering the display region 42. When the organic layer 100 is formed in the form of a layer over the entire surface, the display device is configured such that white light is obtained in all sub-pixels and that a desired color wavelength portion is extracted by a color filter (not shown). In the embodiment, a configuration is employed in which the organic layer 100 is selectively formed for each sub-pixel.

After the formation of the organic layer 100, an upper electrode 84 is formed. In the embodiment, a top-emission structure is employed, and therefore, the upper electrode 84 is formed using a transparent conductive material, for example, ITO or indium zinc oxide (IZO). According to the order of formation of the organic layer 100 described above, the lower electrode 80 serves as an anode, and the upper electrode 84 serves as a cathode.

The upper electrode 84, the organic layer 100, and the lower electrode 80 constitute the organic light-emitting diode 6. In the embodiment, the display device 2 includes: a third organic light-emitting diode 6G including, in a third organic layer 100G thereof, a third light-emitting layer 104G emitting green light; a second organic light-emitting diode 6R including, in a second organic layer 100R thereof, a second light-emitting layer 104R emitting red light; and the first organic light-emitting diode 6B including, in a first organic layer 100B thereof, the first light-emitting layer 104B emitting blue light.

In the embodiment, the first light-emitting layer 104B emitting blue light includes a thermally active material, specifically a thermally activated delayed fluorescent material as an assist dopant. Moreover, the second light-emitting layer 104R emitting red light and the third light-emitting layer 104G emitting green light are the light-emitting layers 104 that do not include the thermally active material, and the second organic light-emitting diode 6R including the second light-emitting layer 104R and the third organic light-emitting diode 6G including the third light-emitting layer 104G are phosphorescent elements.

As disclosed in JP 2013-116975 A, generally in the case of a carrier-injection-type organic EL element, 25% of generated excitons are excited into the excited singlet state, while the remaining 75% are excited into the excited triplet state. Therefore, energy use efficiency is higher when phosphorescence, which is emission from the excited triplet state, is used. However, the excited triplet state is long-lived, which causes energy deactivation due to saturation of the excited state or interaction between excitons in the excited triplet state. Therefore, generally, the quantum yield of phosphorescence is not high in many cases.

On the other hand, a delayed fluorescent material undergoes, after transition in energy to the excited triplet state due to intersystem crossing or the like, reverse intersystem crossing to the excited singlet state due to triplet-triplet annihilation or the absorption of heat energy, and radiates fluorescence. When the delayed fluorescent material is used for an organic EL element, an exciton in the excited singlet state radiates fluorescence as usual. On the other hand, an exciton in the excited triplet state undergoes intersystem crossing to the excited singlet state by absorbing heat and radiates fluorescence. At this time, the emission has the same wavelength as fluorescence because it is emission from the excited triplet state, while the life time of the generated light is longer than that of ordinal fluorescence or phosphorescence due to reverse intersystem crossing from the excited triplet state to the excited singlet state. Therefore, the generated light is observed as fluorescence that is delayed behind the ordinal fluorescence or phosphorescence. This may be defined as delayed fluorescence.

With the use of such a thermally activated exciton moving mechanism, the ratio of compounds in the excited singlet state is raised to 25% or more through the absorption of heat energy after carrier injection, while generally only 25% of compounds are generated in the excited singlet state.

In the embodiment, a configuration has been exemplified in which the heat source resistor 16 (or the heat source resistor 17) is disposed below the first light-emitting layer 104B in the first organic light-emitting diode 6B emitting blue light. However, when a thermally active material such as a thermally activated delayed fluorescent material is used for the light-emitting layer 104 of the organic light-emitting diode 6 of another luminescent color, a configuration may be employed in which the heat source resistor 16 (or the heat source resistor 17) is disposed below the light-emitting layer 104.

The lower electrode 80 of the third organic light-emitting diode 6G is connected to the first drive TFT 12A. The lower electrode 80 of the second organic light-emitting diode 6R is connected to the second drive TFT 12B. The lower electrode 80 of the first organic light-emitting diode 6B is connected to the third drive TFT 12C.

After the formation of the upper electrode 84, a passivation layer 90 is formed. One of the functions of the passivation layer 90 is to prevent the entry of moisture from the outside into the organic layer 100 previously formed, and high gas-barrier properties are required for the passivation layer 90. In the embodiment, a stacked structure of a fourth silicon nitride film 92, an organic resin film 94 made of an acrylic resin or the like, and a fifth silicon nitride film 96 is employed as a stacked structure of the passivation layer 90. Further, the passivation layer 90 may be configured such that a silicon oxide film intervenes between the organic resin film 94 and the fifth silicon nitride film 96.

Through the processes described above, the display device 2 is manufactured. A cover glass, a touch panel substrate, or the like may be provided, as necessary, above the passivation layer 90. In this case, a filling material using resin or the like may intervene between the display device 2 and a cover glass, a touch panel substrate, or the like for filling the gap therebetween.

In the embodiment, as described above with reference to FIGS. 2 to 5, a configuration has been exemplified in which heat is supplied to the light-emitting layer of the organic light-emitting diode 6 by employing a configuration in which the display device 2 includes at least one of the first heat-source power supply line 34 and the second heat-source power supply line 35. However, a configuration may be employed in which heat is supplied to the light-emitting layer of the organic light-emitting diode 6 by disposing a heat-equalizing sheet composed of a copper film or the like on, for example, the rear surface side of the array substrate 50 and further disposing a heat-generating member on the rear surface side of the heat-equalizing sheet.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a substrate;
a first organic light-emitting diode including a first electrode provided above the substrate for each of pixels, a second electrode, and a first light-emitting layer provided between the first electrode and the second electrode, and
a heat source resistor provided in one of the pixels where the first organic light-emitting diode is disposed, wherein
one end of the heat source resistor is connected to a first heat-source power supply line control circuit controlling a potential at the one end of the heat source resistor,
the other end of the heat source resistor is connected to the second electrode, and
the first heat-source power supply line control circuit controls, in supplying heat to the first light-emitting layer, the potential at the one end of the heat source resistor so as to be different from a potential of the second electrode.

2. The display device according to claim 1, wherein the first heat-source power supply line control circuit controls, in not supplying heat to the first light-emitting layer, the potential at the one end of the heat source resistor so as to be the same as the potential of the second electrode.

3. The display device according to claim 1, wherein the first heat-source power supply line control circuit is included in a video line drive circuit connected to a video signal line provided for each of pixel columns of the pixels.

4. The display device according to claim 1, wherein the first light-emitting layer includes a thermally activated delayed fluorescent material.

5. The display device according to claim 4, further comprising a second organic light-emitting diode including a third electrode provided above the substrate for each of pixels, an organic layer provided above the third electrode, a second light-emitting layer provided in the organic layer for each of the pixels and not including the thermally activated delayed fluorescent material, and the second electrode provided above the organic layer, wherein
the heat source resistor is provided in a first pixel where the first organic light-emitting diode is disposed, and
the heat source resistor is not provided in a second pixel where the second organic light-emitting diode is disposed.

6. The display device according to claim 5, wherein a luminescent color of the second light-emitting layer is red or green.

7. The display device according to claim 1, wherein a luminescent color of the first light-emitting layer is blue.

8. A display device comprising:
a substrate;
a first organic light-emitting diode including a first electrode provided above the substrate for each of pixels, a second electrode, and a first light-emitting layer between the first electrode and the second electrode; and
a heat source resistor provided in a sub-light-emitting pixel where the first organic light-emitting diode is disposed, wherein
one end of the heat source resistor is connected to a first heat-source power supply line control circuit controlling a potential at the one end of the heat source resistor, and
the other end of the heat source resistor is fixed at a ground potential.

9. The display device according to claim 8, wherein the first heat-source power supply line control circuit controls, in supplying heat to the first light-emitting layer, the potential at the one end of the heat source resistor so as to be different from the ground potential.

10. The display device according to claim 9, wherein the first heat-source power supply line control circuit controls, in not supplying heat to the first light-emitting layer, the potential at the one end of the heat source resistor so as to be the ground potential.

11. A display device comprising:
a substrate;

a first organic light-emitting diode including a first electrode provided above the substrate for each of pixels, a second electrode, and a first light-emitting layer between the first electrode and the second electrode; and a heat source resistor provided in a sub-light-emitting pixel where the first organic light-emitting diode is disposed, wherein one end of the heat source resistor is connected to a first heat-source power supply line control circuit controlling a potential at the one end of the heat source resistor, and the other end of the heat source resistor is connected to a second heat-source power supply line control circuit controlling a potential at the other end of the heat source resistor.

12. The display device according to claim 11, wherein
the first heat-source power supply line control circuit controls, in supplying heat to the first light-emitting layer, the potential at the one end of the heat source resistor so as to be different from the potential at the other end of the heat source resistor.

13. The display device according to claim 12, wherein
the first heat-source power supply line control circuit controls, in not supplying heat to the first light-emitting layer, the potential at the one end of the heat source resistor so as to be the same as the potential at the other end of the heat source resistor.

14. The display device according to claim 11, wherein
the second heat-source power supply line control circuit controls, in supplying heat to the first light-emitting layer, the potential at the other end of the heat source resistor so as to be different from the potential at the one end of the heat source resistor.

15. The display device according to claim 14, wherein
the second heat-source power supply line control circuit controls, in not supplying heat to the first light-emitting layer, the potential at the other end of the heat source resistor so as to be the same as the potential at the one end of the heat source resistor.

16. The display device according to claim 11, wherein
the first heat-source power supply line control circuit is included in a video line drive circuit connected to a video signal line provided for each of pixel columns of the pixels, and
the second heat-source power supply line control circuit is included in a scanning line drive circuit connected to a scanning signal line provided for each of pixel rows of the pixels.

* * * * *